United States Patent
Azimi et al.

(10) Patent No.: US 8,713,391 B1
(45) Date of Patent: Apr. 29, 2014

(54) SYSTEM AND METHOD FOR TESTING AN INTEGRATED CIRCUIT EMBEDDED IN A SYSTEM ON A CHIP

(71) Applicant: Marvell International Ltd., Hamilton (BM)

(72) Inventors: Saeed Azimi, Union City, CA (US); Son Ho, Los Altos, CA (US); Daniel Smathers, Boulder, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/064,945

(22) Filed: Oct. 28, 2013

Related U.S. Application Data

(60) Continuation of application No. 13/741,496, filed on Jan. 15, 2013, now Pat. No. 8,572,448, which is a continuation of application No. 13/446,627, filed on Apr. 13, 2012, now Pat. No. 8,356,223, which is a continuation of application No. 13/089,660, filed on Apr. 19, 2011, now Pat. No. 8,161,336, which is a continuation of application No. 12/778,225, filed on May 12, 2010, now Pat. No. 7,930,604, which is a continuation of application No. 12/154,896, filed on May 28, 2008, now Pat. No. 7,721,167, which is a division of application No. 11/178,807, filed on Jul. 11, 2005, now Pat. No. 7,496,818, which is a continuation-in-part of application No. 11/065,584, filed on Feb. 24, 2005, now Pat. No. 7,444,571, which is a continuation-in-part of application No. 10/375,986, filed on Feb. 27, 2003, now Pat. No. 7,216,276.

(60) Provisional application No. 60/686,024, filed on May 31, 2005, provisional application No. 60/650,343, filed on Feb. 4, 2005.

(51) Int. Cl.
*G01R 31/28* (2006.01)

(52) U.S. Cl.
USPC .............. 714/733; 714/724; 714/21; 714/25; 714/28; 714/30; 714/31; 714/37; 714/39; 714/50; 714/734; 714/735; 714/736; 714/741; 714/742; 703/28

(58) Field of Classification Search
None
See application file for complete search history.

(56) References Cited

U.S. PATENT DOCUMENTS

| | | | | |
|---|---|---|---|---|
| 4,674,089 A | * | 6/1987 | Poret et al. | ...................... 714/28 |
| 4,897,837 A | | 1/1990 | Ishihara et al. | |

(Continued)

OTHER PUBLICATIONS

IEEE Standard 1149.1-2001 (Revision of IEEE Std 1149.1-1990), IEEE Standard Test Access Port and Boundary-Scan Architecture, (208 pp.).

(Continued)

*Primary Examiner* — John Trimmings

(57) ABSTRACT

A system for testing an integrated circuit, in which the system includes a deserializer, a frame sync module, and a diagnostic module. The deserializer is external to the integrated circuit and is configured to receive messages in a serial data format, wherein the messages include test results associated with the integrated circuit, and deserialize the messages into data frames. The frame sync module is configured to provide control code based on the data frames, wherein the control code includes, in a digital format, status information associated with the messages deserialized into the data frames. The diagnostic module is configured to generate, based on the control code, diagnostic data associated with states of the integrated circuit.

17 Claims, 12 Drawing Sheets

(56) References Cited

U.S. PATENT DOCUMENTS

| | | |
|---|---|---|
| 5,649,129 A | 7/1997 | Kowert |
| 5,689,515 A | 11/1997 | Panis |
| 5,764,952 A | 6/1998 | Hill |
| 5,771,240 A | 6/1998 | Tobin et al. |
| 5,781,560 A | 7/1998 | Kawano et al. |
| 5,812,562 A | 9/1998 | Baeg |
| 5,978,870 A | 11/1999 | Warren |
| 5,978,937 A | 11/1999 | Miyamori et al. |
| 6,028,983 A | 2/2000 | Jaber |
| 6,115,763 A | 9/2000 | Douskey et al. |
| 6,125,416 A * | 9/2000 | Warren ............ 710/71 |
| 6,148,381 A | 11/2000 | Jotwani |
| 6,167,365 A | 12/2000 | Karthikeyan et al. |
| 6,189,115 B1 | 2/2001 | Whetsel |
| 6,279,051 B1 | 8/2001 | Gates et al. |
| 6,282,674 B1 | 8/2001 | Patel et al. |
| 6,289,300 B1 | 9/2001 | Brannick et al. |
| 6,314,530 B1 * | 11/2001 | Mann ............ 714/38.11 |
| 6,321,354 B1 | 11/2001 | Prunier |
| 6,356,960 B1 | 3/2002 | Jones et al. |
| 6,389,558 B1 * | 5/2002 | Herrmann et al. ............ 714/39 |
| 6,389,565 B2 | 5/2002 | Ryan et al. |
| 6,401,191 B1 | 6/2002 | Jones |
| 6,421,795 B2 | 7/2002 | Yamashita |
| 6,457,124 B1 | 9/2002 | Edwards et al. |
| 6,459,393 B1 | 10/2002 | Nordman |
| 6,523,136 B1 | 2/2003 | Higashida |
| 6,526,501 B2 | 2/2003 | Edwards et al. |
| 6,628,679 B1 | 9/2003 | Talarek |
| 6,642,736 B2 | 11/2003 | Mori et al. |
| 6,665,737 B2 * | 12/2003 | Edwards ............ 710/3 |
| 6,687,857 B1 * | 2/2004 | Iwata et al. ............ 714/38.13 |
| 6,690,189 B2 | 2/2004 | Mori et al. |
| 6,779,133 B2 | 8/2004 | Whetsel |
| 6,813,732 B2 | 11/2004 | Kurooka et al. |
| 6,820,051 B1 | 11/2004 | Swoboda |
| 6,834,367 B2 | 12/2004 | Bonneau et al. |
| 6,865,222 B1 | 3/2005 | Payne |
| 6,868,376 B2 | 3/2005 | Swoboda |
| 6,918,058 B2 | 7/2005 | Miura et al. |
| 6,957,180 B1 | 10/2005 | Nemecek |
| 6,973,592 B2 | 12/2005 | Debling |
| 7,003,599 B2 | 2/2006 | Warren et al. |
| 7,007,201 B1 | 2/2006 | Byrne et al. |
| 7,010,612 B1 | 3/2006 | Si et al. |
| 7,031,903 B2 | 4/2006 | Debling |
| 7,076,708 B2 | 7/2006 | Faust et al. |
| 7,080,789 B2 | 7/2006 | Leaming |
| 7,096,310 B2 | 8/2006 | Norden |
| 7,127,649 B2 | 10/2006 | Learning |
| 7,162,410 B1 | 1/2007 | Nemecek et al. |
| 7,197,680 B2 | 3/2007 | Kimelman et al. |
| 7,216,276 B1 * | 5/2007 | Azimi et al. ............ 714/733 |
| 7,278,073 B2 | 10/2007 | Kimelman et al. |
| 7,315,808 B2 * | 1/2008 | Swoboda et al. ............ 703/28 |
| 7,327,725 B2 | 2/2008 | Schriel et al. |
| 7,350,121 B2 | 3/2008 | Creigh |
| 7,363,564 B2 | 4/2008 | Moss et al. |
| 7,412,633 B2 * | 8/2008 | Kimelman et al. ............ 714/724 |
| 7,444,546 B2 | 10/2008 | Kimelman et al. |
| 7,444,571 B1 | 10/2008 | Azimi et al. |
| 7,496,812 B1 | 2/2009 | Azimi et al. |
| 7,496,818 B1 | 2/2009 | Azimi et al. |
| 7,562,276 B1 | 7/2009 | Azimi et al. |
| 7,590,911 B1 | 9/2009 | Azimi et al. |
| 7,721,167 B1 | 5/2010 | Azimi et al. |
| 7,930,604 B1 | 4/2011 | Azimi et al. |
| 2002/0026553 A1 | 2/2002 | Saito |
| 2002/0170006 A1 | 11/2002 | Schaber et al. |
| 2002/0184001 A1 | 12/2002 | Yao |
| 2004/0078690 A1 | 4/2004 | Kohashi |
| 2004/0221201 A1 | 11/2004 | Seroff |

OTHER PUBLICATIONS

IEEE Standard Standard Test Access Port and Boundary-Scan Architecture, Institute of Electrical and Electronics Engineers (IEEE) as IEEE Standard 1149.1-2001, pp. 1-200.

* cited by examiner

SYSTEM AND METHOD FOR TESTING AN INTEGRATED CIRCUIT EMBEDDED IN A SYSTEM ON A CHIP

CROSS-REFERENCE TO RELATED APPLICATIONS

This application is a continuation of U.S. patent application Ser. No. 13/741,496 (now U.S. Pat. No. 8,572,448), filed Jan. 15, 2013, which is a continuation of U.S. patent application Ser. No. 13/446,627 (now U.S. Pat. No. 8,356,223), filed Apr. 13, 2012, which is a continuation of U.S. patent application Ser. No. 13/089,660 (now U.S. Pat. No. 8,161,336), filed Apr. 19, 2011, which is a continuation of U.S. patent application Ser. No. 12/778,225 (now U.S. Pat. No. 7,930,604), filed May 12, 2010, which is a continuation of U.S. patent application Ser. No. 12/154,896 (now U.S. Pat. No. 7,721,167), filed May 28, 2008, which is a divisional of U.S. patent application Ser. No. 11/178,807 (now U.S. Pat. No. 7,496,818), filed Jul. 11, 2005, which claims the benefit of U.S. Provisional Application No. 60/650,343, filed Feb. 4, 2005 and U.S. Provisional Application No. 60/686,024, filed May 31, 2005, and is a continuation-in-part of U.S. patent application Ser. No. 11/065,584 (now U.S. Pat. No. 7,444,571), filed Feb. 24, 2005, which is a continuation-in-part of U.S. patent application Ser. No. 10/375,986 (now U.S. Pat. No. 7,216,276), filed Feb. 27, 2003. The disclosures of the above applications are incorporated herein by reference in their entirety.

TECHNICAL FIELD

This invention relates generally to testing systems and devices and specifically to a system and method for downloading trace information from an integrated circuit.

BACKGROUND OF THE INVENTION

One disadvantage of shrinking microelectronics is that the testing of integrated circuits becomes exponentially more complex. A convenient and efficient means of testing increasingly complex integrated circuits is to design them with testing hardware already built-in. In 1985, a consortium of European electronics companies formed the Joint Test Action Group (JTAG) in order to create an industry standard which would define an architecture and software protocol for built-in testing hardware. The resulting standard, sometimes referred to as JTAG, was adopted by the Institute of Electrical and Electronics Engineers (IEEE) as IEEE Standard 1149.1.

The JTAG standard uses a boundary-scan architecture, so called because the JTAG circuitry is connected to a dedicated path around the integrated circuit's boundary (where the I/O pins are located). JTAG uses this boundary path to directly input to, and download data and instructions from, the I/O pins of the integrated circuit. The JTAG capability of an integrated circuit is accessed through a multi-pin JTAG test access port (TAP), through which instructions and data from external testing software are input and instructions and data from the integrated circuit are output.

The JTAG interface and circuitry can be used to implement debugging and emulation functions. In debugging embodiments, the JTAG interface is used to download code, execute it, and examine register and memory values. In system-on-a-chip (SOC) embodiments which perform emulation, an in-circuit emulator (ICE) is often embedded in the SOC. The embedded ICE is an actual processor, or a specially modified version of the standard processor, combined with special purpose instrumentation logic to perform the debugging and emulation functions. With emulation, one can test the embedded processor software with techniques such as code trace, benchmarking, trapping, evaluating breakpoints, profiling, etc. However, such extra functions usually require extra pins (besides the JTAG TAP) to output the resulting data.

FIG. 1 shows a conventional SOC 100 with an embedded ICE 105 located within the embedded processor 110 of the SOC 100. An external debugging and emulation program, located in personal computer (PC) 120, uses the JTAG interface logic 125 (by means of JTAG TAP, not shown here) to access and control ICE 105. When running, ICE 105 takes over the embedded processor 110 which controls most of the functions of the SOC 100. As such, ICE 105 can access, control, upload, and download from any of the memory 130 or peripheral modules 135 which control other SOC components 137.

The output of the debugging and emulation is forwarded to trace logic 140 and, more particularly, to trace FIFO (First-In, First-Out) buffer 145, where the trace output is collected for download, through trace port and status analyzer 150, to the external debugging and emulation program on PC 120, where the trace output is analyzed.

One problem with the prior art design is that the trace port and status analyzer 150 uses multiple pins of the SOC for the parallel output of the trace data. The amount of data is thus limited by the number of pins which can be designated as trace output pins in the SOC design. As SOCs become more complex and faster, not only does the total number of I/O pins needed for critical functions increase—thus reducing the number of available pins which can be designated as trace output pins—but also the amount of trace data increases, thus requiring more trace output pins for transferring the increased trace data. Furthermore, bandwidth limitations may limit data rates between the trace port and status analyzer 150 and the on chip trace logic 140.

Usually, it is the number of trace output pins that are sacrificed for other uses in integrated circuit design, thereby causing difficulties as well as a bottleneck at the trace port output of the integrated circuit. One solution to this problem is to create a larger trace FIFO buffer 145 so that more data may be stored while the parallel output is downloading as much data as it can. However, area on an integrated circuit is in short supply, and using up more area for a trace FIFO buffer is expensive and wasteful.

SUMMARY OF THE INVENTION

A system is provided that retrieves test information from a target integrated circuit. The system includes a serializer that receives the test information in a first format and that divides and reformats the test information into first and second serial messages. The serializer is located on the target integrated circuit and has a first serial output that sends the first serial message and a second serial output that sends the second serial message. A deserializer communicates with the first and second serial outputs and receives the first serial message and the second serial message. The deserializer retrieves a first portion of the test information from the first serial message and a second portion of the test information from the second serial message, and reconstructs the test information from the first portion and the second portion. The serializer can begin sending the first serial message before beginning to send the second serial message.

In other features, the serializer includes a FIFO buffer and sends the second serial message through the FIFO buffer. The serializer can also attach a synchronization message to each of the first and second serial messages.

In other features, a frame capture module outputs the test information to the serializer. The serializer can attach an idle message to at least one of the first and second serial messages when the frame capture module communicates the test information at a slower rate than the serializer sends the test information via the first and second serial messages. The deserializer can also include a first buffer that stores the first portion and a second buffer that stores the second portion. The first format can be substantially compliant with a Joint Task Action Group (JTAG) format.

A system is also provided that receives Joint Task Action Group (JTAG) data bits from a device under test. The system includes a deserializer that receives serial messages from the device under test and forms data frames based on the serial messages. A frame sync module communicates with the deserializer and forms JTAG data bits based on the data frames. N virtual JTAG test access ports (VTAPs), each having an input and an output, are connected in a daisy chain. The input of a first VTAP receives the JTAG data bits from the frame sync module.

In other features, the system includes a JTAG interface module that communicates with the output of the Nth VTAP. The N VTAPs shift data bits of the test information from the frame sync module to the JTAG interface module. A signal generator module can be in communication with the N VTAPs and communicate with the JTAG interface module. The signal generator module generates a return clock signal output in response to receiving a clock signal input when the Nth VTAP has a data bit. The signal generator module stops generating the return clock signal output when the Nth VTAP does not have a data bit. The N VTAPs can shift the data bits at a faster rate than the JTAG interface module reads the data bits from the Nth VTAP.

A system is also provided that receives data from a device under test. The system includes a deserializer that receives serial messages from the device under test and forms data frames based on the serial messages. A frame sync module communicates with the deserializer and forms the data based on the data frames. A gateway module receives the data and has an output port that provides at least a portion of the test information to a trace port and status analyzer module. The frame sync module and gateway module can communicate using a dual data rate (DDR) connection.

A method is also provided that retrieves test information from a target integrated circuit. The method includes receiving the test information in a first format and dividing and reformatting the test information into first and second serial messages. The method also includes sending the first serial message from a first serial output located on the target integrated circuit and sending the second serial message from a second serial output located on the target integrated circuit. The method receives the first serial message and the second serial message and retrieves a first portion of the test information from the first serial message and a second portion of the test information from the second serial message. The method reconstructs the test information from the first portion and the second portion.

In other features, the step of sending the first serial message begins before the step of sending the second serial message. The second serial message can be sent through a FIFO buffer. In some variations, the method includes attaching a synchronization message to each of the first and second serial messages. A frame capture module can be provided that outputs the test information.

In other features, the method includes attaching an idle message to at least one of the first and second serial messages when the frame capture module communicates the test information at a slower rate than the test information is sent via the first and second serial messages. The retrieving step can include storing the first portion in a first buffer and storing the second portion in a second buffer. The first format can be substantially compliant with a Joint Task Action Group (JTAG) format.

A method is also provided that receives Joint Task Action Group (JTAG) data bits from a device under test. The method includes receiving serial messages from a device under test and forming data frames based on the serial messages. The method forms JTAG data bits based on the data frames and communicates the JTAG data bits into a first of N virtual JTAG test access ports (VTAPs), each of which has an input and an output. The N VTAPs are connected in a daisy chain.

In other features, the method includes shifting the data bits of the test information through the N VTAPs, wherein the output of the Nth VTAP communicates the data bits to a JTAG interface module. The method can also include generating a return clock signal output in response to receiving a clock signal input when the Nth VTAP has a data bit. The method can stop generating the return clock signal output when the Nth VTAP does not have a data bit. The data bits can be shifted through the N VTAPs at a faster rate than the JTAG interface module reads the data bits from the Nth VTAP.

A method is also provided that receives data from a device under test. The method includes receiving serial messages from the device under test and forming data frames based on the serial messages. The method forms the data based on the data frames and provides at least a portion of the test information via the data frames to a trace port and status analyzer module.

A system is also provided that retrieves test information from a target integrated circuit. The system includes serializing means for receiving the test information in a first format and for reformatting the test information into first and second serial messages. The serializing means is located on the target integrated circuit and has first serial output means for sending the first serial message and second serial output means for sending the second serial message. The system also includes deserializing means for communicating with the first and second serial output means and for receiving the first serial message and the second serial message. The deserializing means retrieves a first portion of the test information from the first serial message and a second portion of the test information from the second serial message and reconstructs the test information from the first portion and the second portion.

In other features, the serializing means begins sending the first serial message before beginning to send the second serial message. The serializing means further includes FIFO buffer means for sorting and sending the second serial message through the FIFO buffer means. The serializing means attaches a synchronization message to each of the first and second serial messages.

In other features, the system includes frame capture means for outputting the test information to the serializing means. The serializing means attaches an idle message to at least one of the first and second serial messages when the frame capture means communicates the test information at a slower rate than the serializing means sends the test information via the first and second serial messages. The deserializing means also includes first buffer means for storing the first portion and second buffer means for storing the second portion. The first format can be substantially compliant with a Joint Task Action Group (JTAG) format.

A system is also provided that receives Joint Task Action Group (JTAG) data bits from a device under test. The system includes deserializing means for receiving serial messages from a device under test and forming data frames based on the serial messages. The system also includes frame sync means for communicating with the deserializing means and forming JTAG data bits based on the data frames. N virtual JTAG test access ports (VTAP) means for communicating, each having input means for receiving input and output means for generating output, are connected in a daisy chain and the input means of a first VTAP means receives the JTAG data bits from the frame sync means.

In other features, the system includes JTAG interface means for communicating with the output means of the Nth VTAP means. The N VTAP means shift data bits of the test information from the frame sync means to the JTAG interface means. Signal generator means for generating communicates with the N VTAP means and the JTAG interface means. The signal generator means generates a return clock signal output in response to receiving a clock signal input when the Nth VTAP means has a data bit. The signal generator means stops generating the return clock signal output when the Nth VTAP means does not have a data bit. The N VTAP means shifts the data bits at a faster rate than the JTAG interface means reads the bits from the Nth VTAP means.

A system is also provided that receives data from a device under test. The system includes deserializing means for receiving serial messages from the device under test and for forming data frames based on the serial messages. The system also includes frame sync means for communicating with the deserializing means and for forming the data based on the data frames. Gateway means for receiving the data have output port means for providing at least a portion of the test information to trace port means and status analyzer means. The frame sync means and gateway means can communicate using dual data rate (DDR) connection means for providing a connection.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

Figure 1:
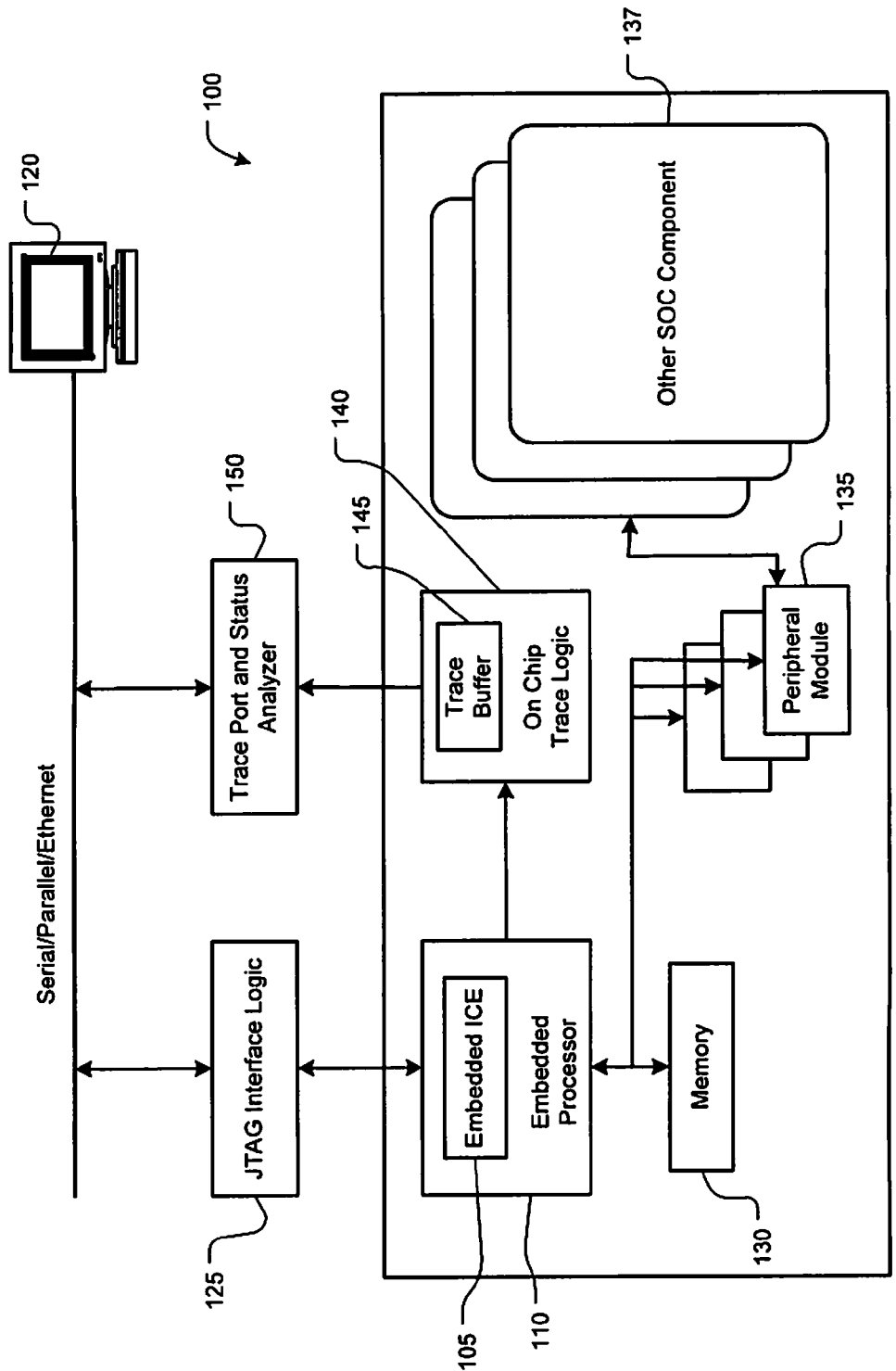
FIG. 1 is a block diagram of a prior art debugging and emulation system for a system-on-a-chip (SOC)

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 2:
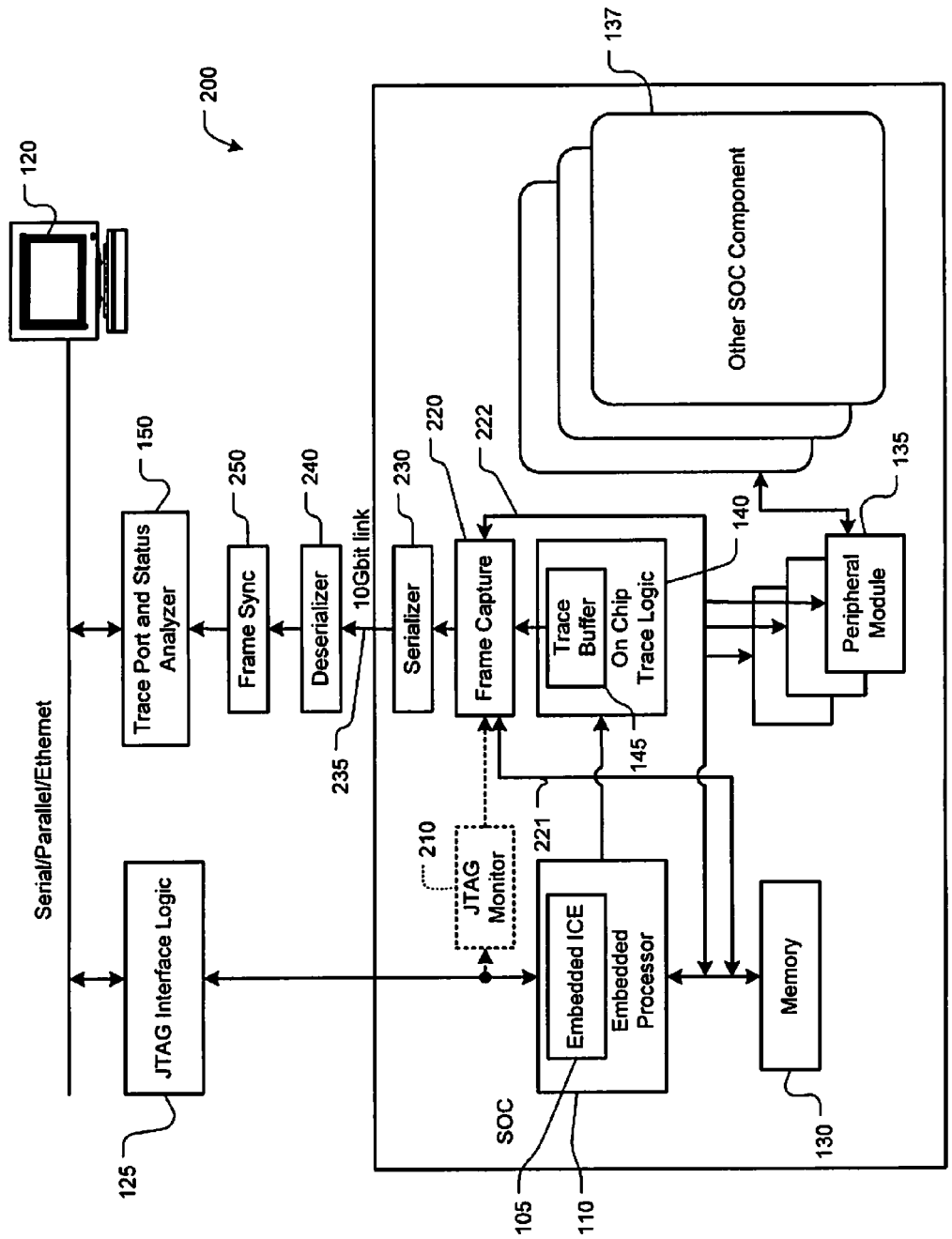
FIG. 2 is a block diagram of a debugging and emulation system for an SOC according to a preferred embodiment of the present invention.

FIG. 2 shows an SOC 200 with a debugging and emulation system according to a preferred embodiment of the present invention. Similarly to FIG. 1, embedded ICE 105 is located within embedded processor 110. An external debugging and emulation program, located in PC 120, uses the JTAG interface logic 125 (by means of JTAG TAP, not shown here) to access and control ICE 105. ICE 105 can access, control, upload, and download from any memory 130 or peripheral modules 135 which control other SOC components 137. The output of the debugging and emulation is forwarded to trace logic 140 and, more particularly, to trace FIFO (First-In, First-Out) 145.

Although the preferred embodiment in FIG. 2 uses a JTAG interface 125, it should be understood that the present invention is not limited to such an interface. In fact, any debugging and testing hardware, with or without an emulator, may be used with the present invention. Furthermore, the memory 130 may be any sort of memory, whether volatile or non-volatile, in an integrated circuit, and the trace buffer 145 may have any sort of configuration (i.e., it is not limited to a FIFO configuration).

Unlike FIG. 1, the output of trace FIFO 145 does not go directly to a trace output 150 port. Instead, the trace FIFO 145 output is forwarded to Frame Capture Unit 220 where it, along with other data, is packaged into frames. In other embodiments, it is possible for Frame Capture Unit 220 to capture data from the memory subsystems of the SOC (indicated by line 221) or from peripheral modules 135 (indicated by line 222). The frames into which this data is packaged are the communication units used by the serial output. Once a frame is completed it is forwarded to Serializer 230, which converts the parallel format of the frames to serial format for output. Once serialized, the data is transferred out of SOC 200 on communication link 235. To connect with SOC 200, communication link 235 only requires the minimum number of pins. In the preferred embodiment, there are only two pins used for serial differential output versus the nine or more pins used in the prior art.

In the present invention, a SERDES interface capable of transmission rates in the gigabit range is used to serially transmit data from the trace FIFO to the analyzing software on PC 120. In some implementations, a 10 Gb SERDES using XAUI circuitry can be employed. Alternatively, one, two or more 4.25 Gb/s links (each generally requiring two (differential) pins) can be employed.

After the serialized data has crossed communication link 235, it arrives at Deserializer 240, where the data is reconfigured into its original parallel format. Thereafter, the data enters Frame Sync Unit 250 which synchronizes the parallel data so that the correct boundaries between an incoming frame and the next incoming frame can be located or otherwise established. While Ethernet frames can be used, custom frames may be used to increase efficiency.

Once the frame boundaries are restored, the original data can be unpackaged from the frames and sent to the debugging and emulation software on PC 120. Such a transmission could be carried out, for example, by an interface connecting Frame Sync Unit 250 with a local area network (LAN), such as an Ethernet LAN. In other embodiments, it would be possible to connect the Frame Sync Unit 250 directly with a wide area network (WAN), such as the Internet, so that troubleshooting may be performed remotely. The Trace Port and Status Analyzer 150 captures the data now in parallel format in a large SRAM buffer for later analysis by the software on PC 120.

An optional JTAG Monitor 210 receives configuration information from the external debugging and emulation program, located in PC 120, through JTAG interface logic 125 and ICE 105. This information is used to appropriately configure the Frame Capture Unit 220 to accept incoming data from trace FIFO buffer 145. In some implementations, the embedded processor 110 performs this function. This is needed because the timing and manner in which framing should be performed will be affected by the nature of the testing being performed, the nature of the testing output, the timing of the testing output, synchronization with the external system bus, etc. If used, the JTAG monitor 210 may be very simple (e.g., comprised of a few registers) or very complex, depending on the embodiment of the present invention, and particularly depending on the types and sources of data being input into Frame Capture Unit 220.

Figure 2A:
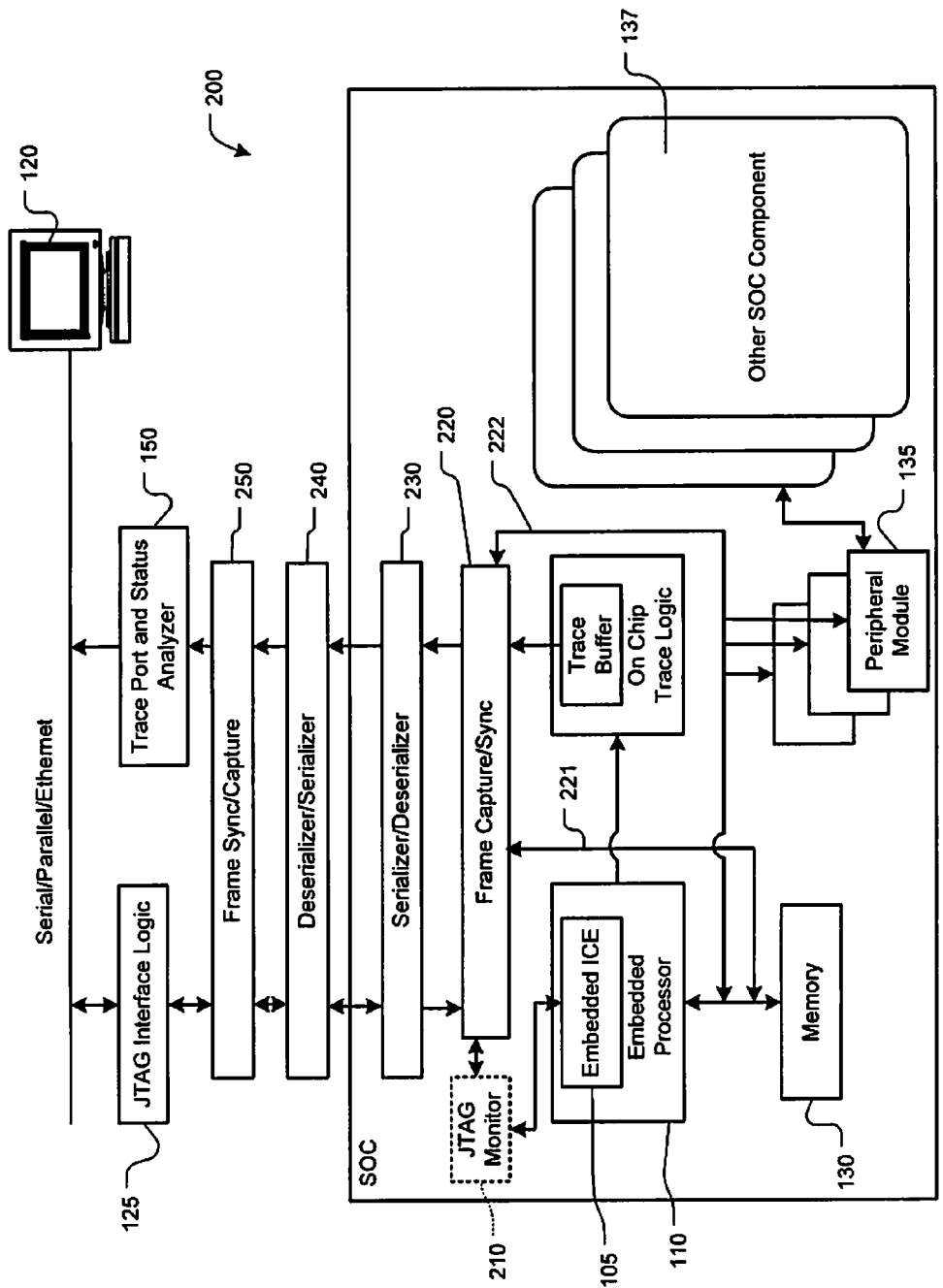
FIG. 2A is a block diagram of a debugging and emulation system for an SOC according to another preferred embodiment of the present invention.

FIG. 2A is a block diagram of a debugging and emulation system for an SOC according to another preferred embodiment of the present invention. The SERDES in FIG. 2A is bi-directional, in contrast to the uni-directional SERDES of FIG. 2. Thus, in addition to serving as the output for the testing and debugging data, the SERDES in FIG. 2A also serves as the input for the instructions and data which the testing and debugging program on PC 120 sends to embedded ICE 105 and embedded processor 110.

Some of the components of the SERDES in FIG. 2A have dual functions. For instance, Frame Sync Unit 230 in FIG. 2A acts as both a Frame Sync unit for the testing and debugging of data returning to the analysis software on PC 120, and as a Frame Capture Unit for the instructions and data which the analysis software on PC 120 is sending to the embedded ICE 105 and embedded processor 110. Both Serializer 230 and Deserializer 240 in FIG. 2A are combination Serializer/Deserializers for the bi-directional data traffic. Also, the Frame Sync Unit 250 and Frame Capture Unit 220 serve dual functions, namely frame synchronizing and frame capturing. The bi-directional SERDES of FIG. 2A may or may not need JTAG Monitor 210. It is contemplated that configuration data for Frame Capture Unit 220 may come directly from the analysis software on PC 120 through the bi-directional SERDES itself, thereby obviating any need for a separate JTAG Monitor 210. Furthermore, the present invention is not limited to using a JTAG interface, so that any hardware/firmware/software protocol for testing and debugging an integrated circuit may be used with the present invention.

Figure 3:
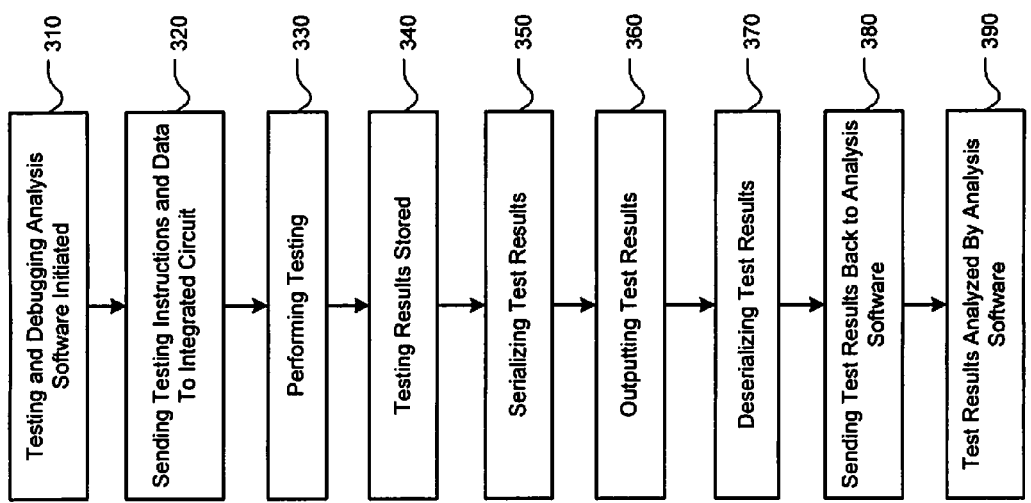
FIG. 3 is a flowchart showing a method for outputting debugging and emulation data from an SOC according to a preferred embodiment of the present invention.

A flow chart generally illustrating a method for testing and debugging an integrated circuit according to a preferred embodiment of the present invention is shown in FIG. 3. In step 310, the testing and debugging analysis software on PC 120 is initiated. In step 320, instructions for testing the integrated circuit and testing data are sent from the analysis software to the integrated circuit. In step 330, testing is performed on the integrated circuit in accordance with the testing instructions and data sent from the analysis software. The results of this testing and other data is stored in step 340. The stored data is serialized in step 350, and output off the integrated circuit in step 360. In step 370, the output data is deserialized and sent back to the analysis software in step 380. Finally, the testing results and data is analyzed in step 390 by the testing and debugging analysis software on PC 120.

Although the steps in FIG. 3 are shown in a particular order, it should be understood that these steps may occur in a different order, or even simultaneously. For example, steps 320 through 380 may be occurring substantially simultaneously, i.e., a train of instructions may be input (step 320) at the same time as results from the first instructions are arriving back at the analysis software in PC 120 (step 380). Furthermore, the steps should be understood in their broadest context. For example, storing step 340 may comprise storing testing results and data in longer term large-scale memory, such as ROM, RAM or external DRAM (not shown), for later framing operations, or in short term small scale memory, such as a bank of registers, for immediate processing and output. Step 340 may also occur between steps 370 and 380 as will be described in conjunction with FIG. 4.

Figure 3A:
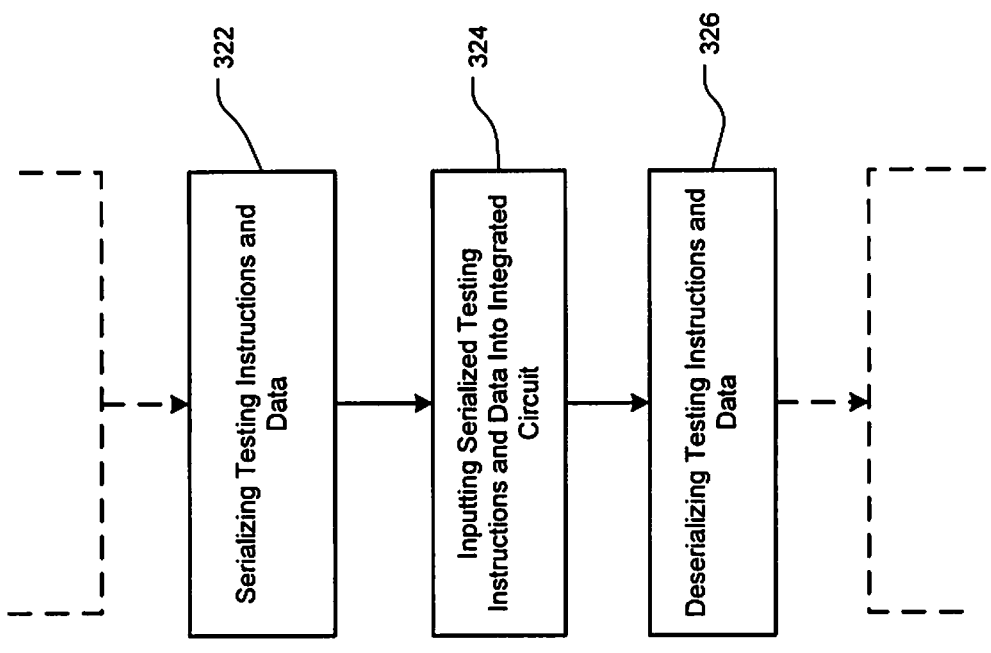
FIG. 3A is flowchart showing the sub-steps comprising step 320 in FIG. 3 according to another embodiment of the present invention.

FIG. 3A is a flowchart illustrating the sub-steps comprising the step of sending instructions for testing the integrated circuit and testing data from the analysis software to the integrated circuit (step 320 from FIG. 3) according to another embodiment of the present invention. These steps generally illustrate the operation of the embodiment shown in FIG. 2A. In such an embodiment, the inventive SERDES serves as both the input and the output for the testing and debugging operations. Returning to FIG. 3A, in step 322, the instructions and data from the analysis software on PC 120 are serialized before being input in step 324 into the integrated circuit. Once on-chip (i.e., in integrated circuit 200), the instructions and data are deserialized in step 326 so that they may be used by the on-chip testing and debugging hardware.

Some of the advantages of the present invention can be seen in the preferred embodiment described herein. Specifically, the number of pins required for the output of trace FIFO and other data is substantially reduced. Since there are a limited number of pins on an integrated circuit, the reduction of trace output pins increases the number of I/O pins available for other functions. This advantage will have increasing importance as integrated circuits become more complex and smaller. Yet another advantage is the elimination of the prior art high speed parallel interfaces which greatly increase chip power. Still another advantage is the reduced cost of packaging when implementing the present invention.

Figure 4:
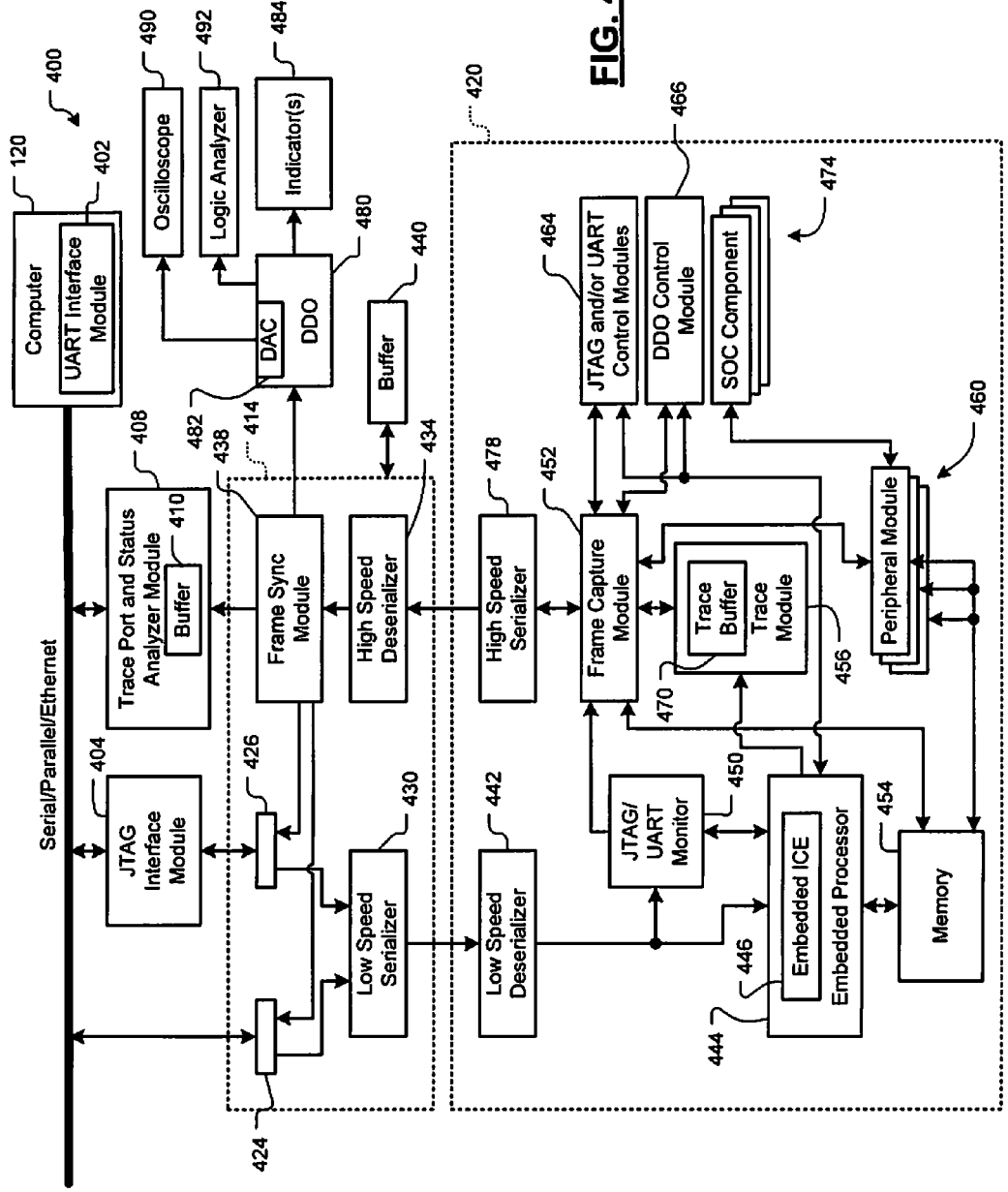
FIG. 4 is a functional block diagram of an alternate debugging and emulation system.

Referring now to FIG. 4, an alternate debugging and emulation system according to some implementations is shown generally at 400. The debugging and emulation system 400 includes a host device 120 such as a computer running an external debugging and emulation program. The host device 120 incorporates universal asynchronous receiver transmitter (UART) module 402 and/or interfaces with JTAG interface module 404 which send/receive control code such as test instructions and data such as test data, register values, and memory values to a system on chip 420 using UART and JTAG formats. The host device 120 also receives test results via host trace port and status analyzer 408, which may include a buffer 410. The buffer 410 may store data when the connection between the trace port and the PC is slower than the data being collected at the trace port. A serializing/deserializing module 414 according to some implementations of the present invention significantly reduces the number of pins that are required to interface the UART interface module 402, the JTAG interface module 404 and/or the trace port and status analyzer 408 to the SOC 420.

In some implementations, the serializing/deserializing module 414 is an integrated circuit. The serializing/deserializing module 414 includes interfaces 424 and 426 that communicate with the UART and JTAG interface modules 402 and 404, respectively. The UART interface module 402 sends UART control code and/or data via the interface 424 to a low speed serializer 430. The JTAG interface module 404 sends JTAG control code and/or data via the interface 426 to the low speed serializer 430. In some implementations, the interfaces 424 and 426 can be combined. In one implementation, the low speed serializer 430 operates at data rates less than 200 Mb/s. In other implementations, the low speed serializer 430 operates at data rates around 100 Mb/s.

A frame sync module 438 selectively transmits UART control code and/or data to the UART interface module 402 via the interface 424. The frame sync module 438 selectively sends JTAG control code and/or data to the JTAG interface module 404 via the interface 426. The frame sync module 438 selectively sends the test results and/or other output of debugging and emulation to the trace port and status analyzer 408. In some implementations, the frame sync module 438 also selectively sends control code (such as state data, error messages, etc.) to a data diagnostic output (DDO) module 480, as will be described below.

An input of a high speed deserializer 434 receives data from a high speed serializer 478 in the SOC 420. In some implementations, the high speed deserializer 434 is connected to the SOC 420 using two or four pins. In one implementation, the high speed serializer/deserializer operates at data rates greater than or equal to 800 Mb/s. In other implementations, the high speed serializer/deserializer operates at data rates greater than or equal to 1 Gb/s. In still other implementations, the high speed serializer/deserializer operates at speeds greater than or equal to 5 or 10 Gb/s. External memory 440 such as DRAM may be provided for buffering data if desired. In some implementations, the memory 440 contains at least 50 MB of storage.

The SOC 420 also includes a low speed deserializer 442 that deserializes data sent by the low speed serializer 430. The low speed deserializer 442 outputs deserialized data to an embedded processor 444 having an embedded ICE 446 and to JTAG/UART monitor module 450. The JTAG/UART monitor module 450 interprets JTAG/UART control code and/or data and/or configures the embedded processor 444 and/or a frame capture module 452 for the appropriate format. The frame capture module 452, in turn, stores/retrieves data to/from memory 454 and receives results of emulation and debugging from trace module 456 (and trace buffer 470) and/or peripheral modules 460. The peripheral modules 560 control the frame capture module 452 that packages data that is output by the SOC 420 into frames. In some implementations, the SOC components 474 may communicate directly with the frame capture module 452. JTAG and/or UART control modules 464 and/or DDO control module 466 selectively send control code and/or data to UART interface module 402, JTAG interface module 404 and/or DDO module 480 as needed. The JTAG and UART control modules 464 may be considered part of the peripheral modules 460. The memory 454 also stores data for the peripheral modules 460 and the embedded processor 444. The embedded processor 444 also communicates with the JTAG and/or UART controllers 464 and the DDO module 466.

The high speed deserializer 434 deserializes data received from the high speed serializer 478 and outputs the serialized data to the frame sync module 438. The frame sync module 438 selectively outputs data to an external diagnostic data output (DDO) module 480 that includes a digital to analog converter (DAC) 482. The external DDO module 480 outputs state signals from DDO control module 466 to state indicator(s) 484 such as light emitting diodes (LEDs), other types of displays and/or audible outputs. The DAC 482 outputs analog output signals from DDO control module 466 to an oscilloscope 490. The DDO module 480 outputs digital signals to a logic analyzer 492.

In use, the external debugging and emulation program in the host device 120 uses the UART and/or JTAG interface modules 402 and 404 to access and control the embedded ICE 446. The embedded ICE 446 can access, control, upload and download data to/from memory 454 and/or peripheral modules 460, which control other SOC components 474. The output of the debugging and emulation process is forwarded to the trace module 456 and/or the trace buffer 470.

The frame capture module 452 packages data from the trace logic 456 and control code, data, state data, and/or error messages from the JTAG and/or UART control module 464 and/or the DDO control module 466 into frames. In some implementations, the frames include control frames and trace data frames. The DDO module 480 and interfaces 424 and 426 receive control information after alignment by frame sync module 438.

The parallel frame data is serialized by the high speed serializer 478 and output serially to the high speed deserializer 434. As can be appreciated, the number of pins can be significantly reduced without adversely impacting bandwidth. The high speed deserializer 434 returns the serial data back to a parallel format. The frame sync module 438 receives the parallel data from the high speed deserializer 434 and synchronizes frames. The frames are output to the trace port and status analyzer 408. Depending upon the type of control interface that is used, the data may also be output by the frame sync module 438 to the UART interface module 402, the JTAG interface module 404 and/or the DDO module 480.

The JTAG/UART monitor module 450 receives configuration information from the external debugging and emulation program through the UART and/or JTAG interface logic. The JTAG monitor portion of JTAG/UART monitor 450 can be performed by the embedded processor 444 as described above. The information is used by the JTAG/UART monitor module 450 to configure the frame capture module 452 and/or the embedded ICE 446. The timing and manner in which framing is performed may be affected by the nature of the testing to be performed, the nature of the testing output, the timing of the testing output, synchronization, etc. The JTAG and/or UART control modules 464 generate control information for the UART and JTAG interface modules 402 and 404.

Figure 5:
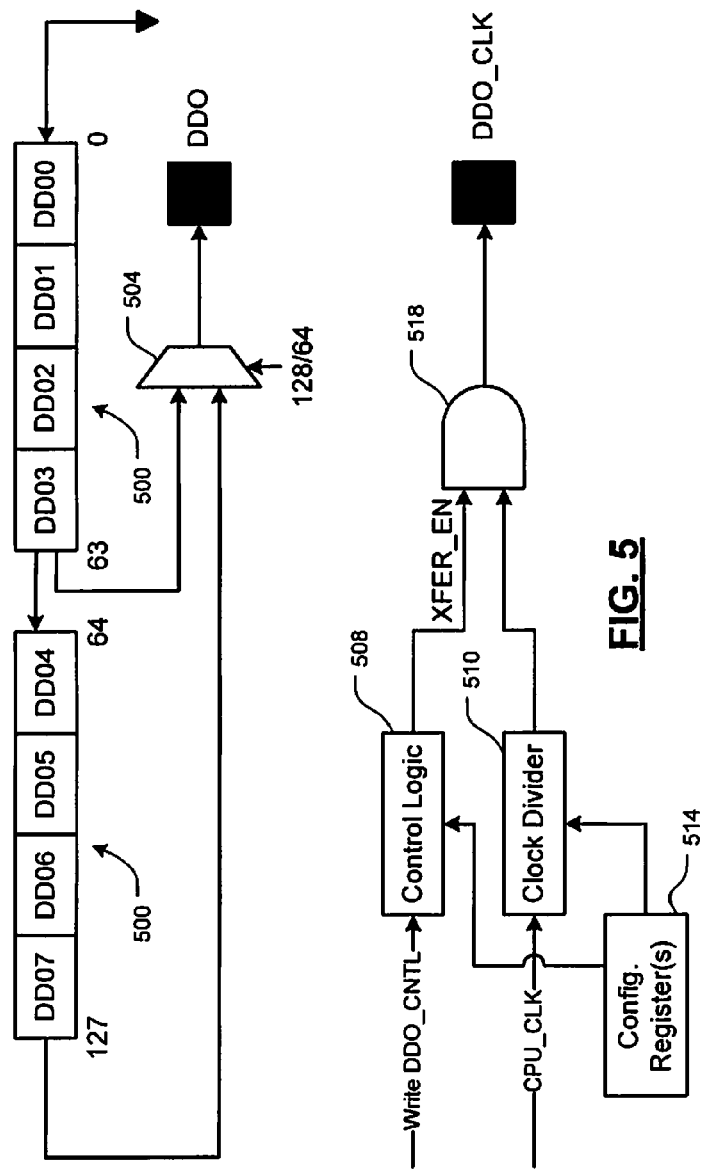
FIG. 5 is a functional block diagram of a diagnostic data output (DDO) module of the system in FIG. 4.
Figure 6:
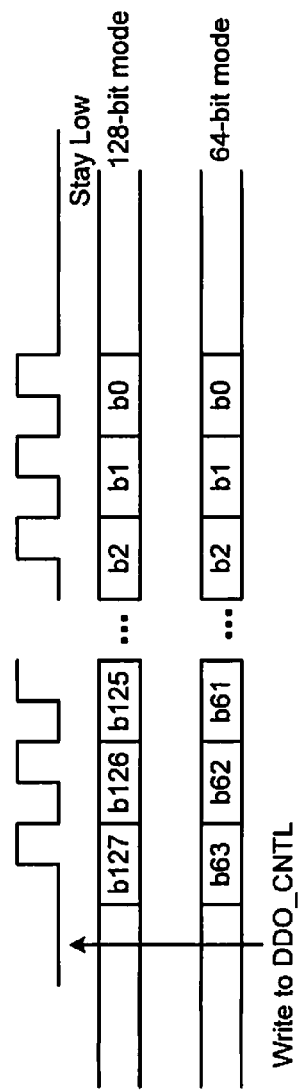
FIG. 6 is a signal diagram illustrating operation of the DDO module.

Referring now to FIGS. 5 and 6, additional details relating to the DDO control module 466 are shown. The DDO control module 466 allows firmware to send data such as control code, state messages and/or error messages. Some state messages and/or error messages are best viewed in analog format.

Therefore, these messages are selectively converted by the DAC 482 to analog signals for viewing on the oscilloscope 490. In some implementations, the DDO control module 466 employs a 2 pin digital output.

In some implementations, the DDO control module 466 includes data registers 500 and a mode-selecting multiplexer 504. Control logic 508 receives a write DDO_CNTRL signal and a clock divider 510 receives a CPU_CLK signal. The control logic 508 and the clock divider 510 may also communicate with configuration registers 514. Outputs of the control logic 508 and clock divider 510 are output to an AND gate, which outputs DDO_CLK.

The DDO control module 466 allows firmware to send up to 8 words of digital information on the DDO and DDO_CLK pins. The DDO pin carries the serial data shifted out from DDO registers [7:0]. The DDO signal is synchronous to DDO_CLK, which is toggled only while shifting out DDO data. While 8 words are shown, skilled artisans will appreciate that additional and/or fewer words can be accommodated.

DDO_CLK may be generated by dividing the CPU_CLK signal by an integer such as 2, 4, 8, etc. Clock divider and clock source selection can also be made programmable using the configuration registers 514. For example, to send out 4 words of data, the DDO[63:48] and DDO[15:0] registers are used. To send out 8 words of data, the DDO[127:112] through DDO[15:0] are used. After the CPU writes the control logic bits into W_64_DDO or W_128_DDO, the register starts the DDO clock and DDO shifts out. The MSB is sent first.

In some implementations, either JTAG or UART control is active during emulation and debugging. DDO can be either active or inactive during emulation and debugging. In other implementations, JTAG, UART and DDO are active during emulation and debugging.

Figure 7:
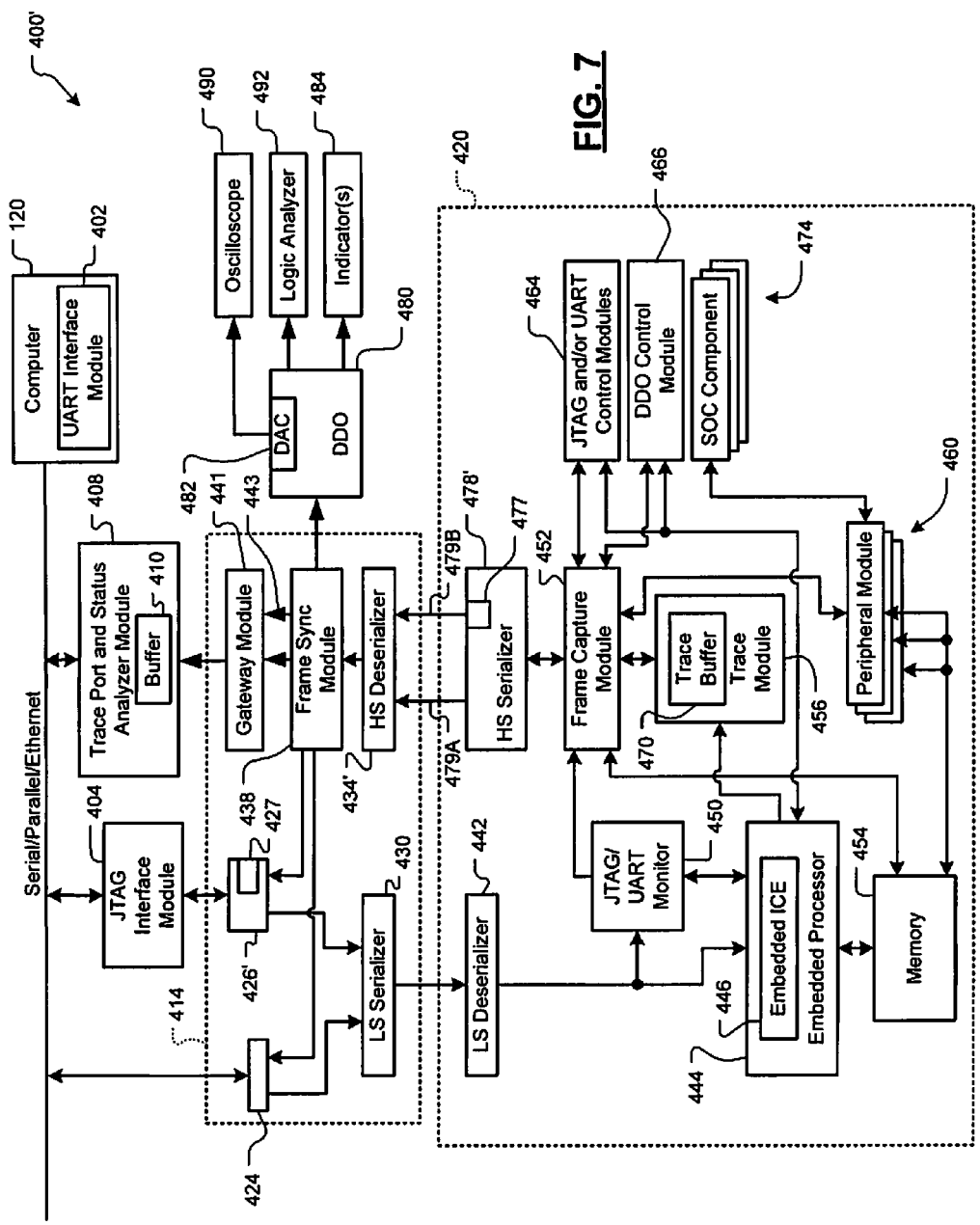
FIG. 7 is a functional block diagram of the debugging and emulation system of FIG. 4 according to one or more alternative embodiments.

Referring now to FIG. 7, variations of the debugging and emulation system 400 are shown generally at 400'. The variations operate independently of one another and can be used alone or in combination with each other. In a first variation, an interface 426' includes a TAP module 427 having virtual JTAG TAP nodes. The TAP module 427 may be used in accordance with methods described later herein to reduce time required to test the SOC 420.

In a second variation, a first serial link 479A provides data from a high speed serializer 478' to a high speed deserializer 434'. Some applications require higher bandwidth than can be provided by the first serial link 479A operating alone. In such applications, a second serial link 479B may also provide data from the high speed serializer 478' to the high speed deserializer 434'. A first-in, first out (FIFO) buffer 477 provides a delay between sending data over the first and second serial links 479A and 479B. While the FIFO buffer 477 is shown as part of the high speed serializer 478', the FIFO buffer 477 can stand alone or incorporated into another component. The FIFO buffer 477 provides a path between a first clock domain associated with the first serial link 479A and a second clock domain associated with the second serial link 479B. The high speed deserializer 434' selectively outputs data to the external diagnostic data output (DDO) module 480.

In a third variation, a gateway module 441 is connected between the frame sync module 438 and the trace port and status analyzer module 408. The frame sync module 438 may provide a clock signal 443 that synchronizes data transfers to the gateway module 441. As can be appreciated, the clock signal may be generated by a counter, an oscillator and/or other components. The gateway module 441 converts signal levels and signal timings from a format used by the frame sync module 438 to signal levels and signal timings used by the trace port and status analyzer 408. For example, the frame synch module 438 may use dual data rate (DDR) output timing that provides first valid data on a rising edge of the clock signal 443, and second valid data on a falling edge of the clock signal 443. The trace port and status analyzer 408 may be obtained from a third-party and has input specifications that provide signal levels and timing between it and the gateway module 441. Depending upon the type of control interface that is used, the data may also be output by the frame sync module 438 to the UART interface module 402, the JTAG interface module 404 and/or the DDO module 480.

Figure 8A:
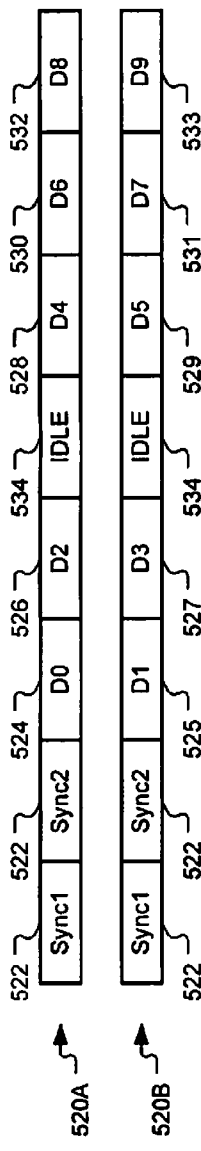
FIG. 8A is a timing diagram showing data in the system of FIG. 7.

Referring now to FIG. 8A, a timing diagram is shown of a first serial message 520A and a second serial message 520B that are sent from the frame capture module 452 to the high speed serializer 478'. The first and second serial messages 520A, 520B are referred to collectively as the serial messages 520. Each of the serial messages 520 begins with one or more synchronization frames 522. The synchronization frames 522 are followed by data frames 524-533. The first serial message 530A carries even-numbered data frames and the second serial message 520B carries odd-numbered data frames. The synchronization messages 522 are preferably chosen so that they cannot be identical to a misaligned data frame. Idle frames 534 may be substituted for the data frames when the high speed serializer 478' is sending the serial messages 520 faster than data is being provided by the frame capture module 452.

Figure 8B:
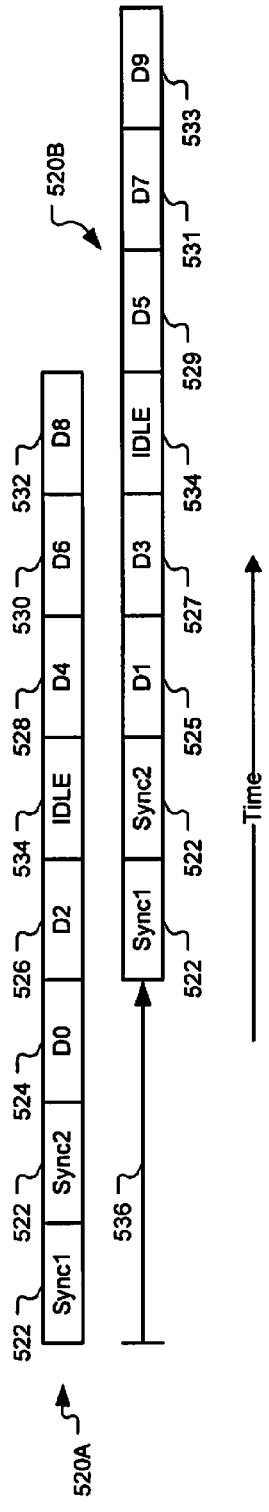
FIG. 8B is a timing diagram showing data in the system of FIG. 7.

Referring now to FIG. 8B, a timing diagram is shown of the serial messages 520. The first serial link 479A begins sending the first serial message 520A while the second serial message 520B begins propagating through the FIFO buffer 477. The second serial link 479B begins sending the second serial message 520B after the first serial link 479A has started sending the first serial message 520A. A delay period 536 between a beginning of the first serial message 520A and a beginning of the second serial message 520B is preferably less than a duration of either of the serial messages 520. The delay period 536 is established by a propagation delay through the FIFO buffer 477.

Figure 8C:
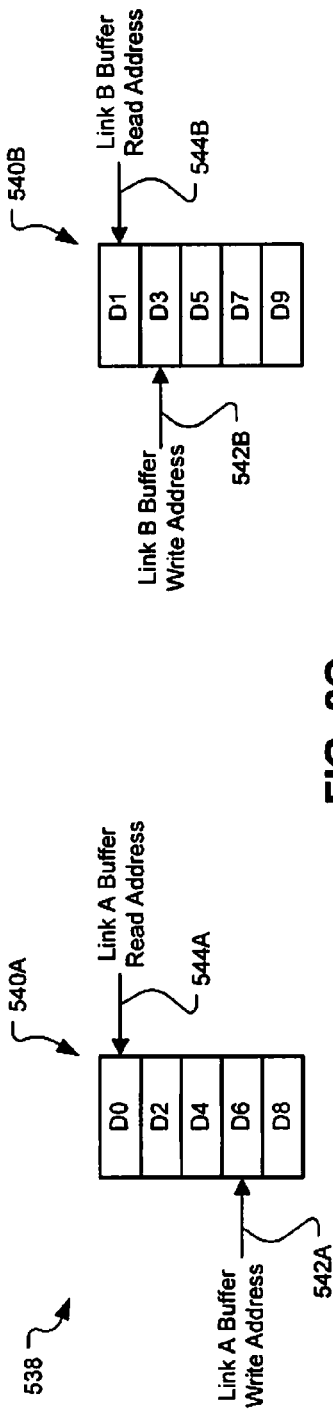
FIG. 8C is a functional block diagram of a receive buffer for the data of FIG. 8B.

Referring now to FIG. 8C, a block diagram is shown of a receive buffer 538 suitable for receiving the serial messages 520. The receive buffer 538 may be located in the high speed deserializer 434 and has a first array 540A of memory spaces and a second array 540B of memory spaces. A width of each memory space is equal to a length of each data message. In some embodiments, the memory space width and the data message length are both equal to 32 bits. In some embodiments, a number of memory spaces in each of the arrays 540A and 540B is equal to an integer divisor of the number of data messages contained in each of the serial messages 520.

A first write pointer 542A points to an empty memory space available to hold the next data message to arrive with the first serial message 520A. A second write pointer 542B points to an empty memory space available to hold the next data message to arrive with the second serial message 520B. A first read pointer 544A points to the memory space holding a next data message to be read from the first array 540A. A second read pointer 544B points to the memory space holding a next data message to be read from the second array 540B.

Operation of the receive buffer 538 will now be described. Upon receiving the framing message 522 over the first serial link 479A, the first write pointer 542A is reset to point to the first memory location in the first array 540A. Thereafter, the first write pointer 542A is incremented after each data message has been received over the first serial link 479A and written to the memory space pointed to by the first write pointer 542A. No action is taken upon receiving the idle message(s) 534.

Upon receiving the framing message 522 over the second serial link 479B, the second write pointer 542B is reset to point to the first memory location in the second array 540B. Thereafter, the second write pointer 542B is incremented after each data message has been received over the second serial link 479B and written to the memory space pointed at by the second write pointer 542B. No action is taken upon receiving the idle message(s) 534. Since the first serial link 479A begins transmitting before the second serial link 479B, there will be a data message available for reading from the first array 540A when the second array 540B receives its first data message.

The high speed deserializer 434 reassembles the data messages in order by first reading the memory location pointed to by the first read pointer 544A and then reading from the memory location pointed to by the second read pointer 544B. Prior to each reading step, the first and second read pointers 544A, 544B point to the memory locations having the oldest data message in each respective array 540A and 540B. The first and second read pointers 544A and 544B are incremented each time the respective memory location they point to has been read. The high speed deserializer 434 repeats the reading sequence until all of the data messages have been received and reassembled in their original order.

Figure 9:
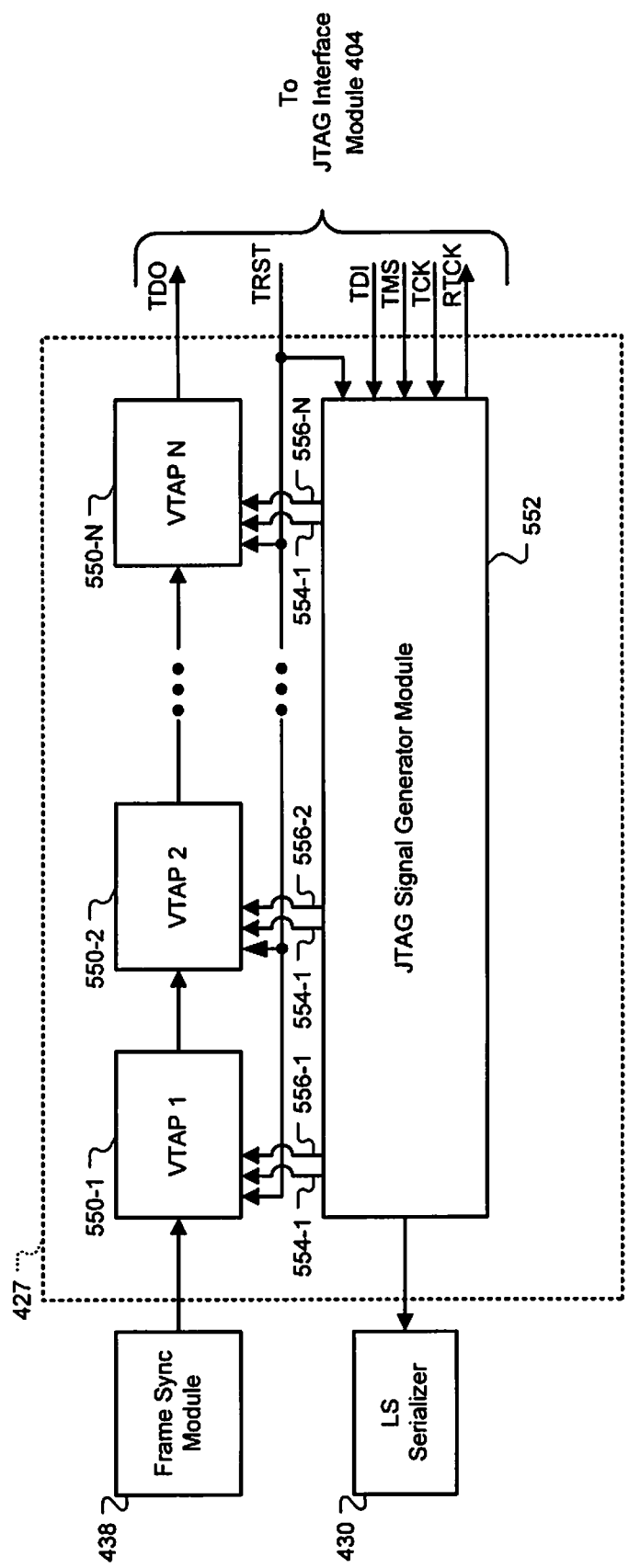
FIG. 9 is a functional block diagram of a module having virtual JTAG test access ports (VTAPs)

Referring now to FIG. 9, a functional block diagram of the TAP module 427 is shown. Virtual JTAG TAPs (VTAPs) 550-1, 550-2, ... 500-N, referred to collectively as the VTAPs 550, each have an input and an output and are connected together in a daisy chain fashion. Unlike actual JTAG TAPs, the VTAPs 550 are not located in a device under test, such as the SOC 420. The input of the first VTAP 550-1 is connected to an output of the frame sync module 438. The output of the last VTAP 550-N is connected to a TDO input of the JTAG interface module 404. A reset signal TRST is connected to the VTAPs 550 and a JTAG control signal generator module 552. The signal generator module 552 provides separate TMS 554-1 ... 541-N and TCK 556-1 ... 556-N signals to each of the VTAPs 550. The JTAG interface module 404 provides a test data input (TDI) signal, a TMS signal, a TCK signal, and the TRST to the signal generator module 552. The signal generator module 552 may provide a return clock (RTCK) signal to the JTAG interface module 404. The signal generator module 552 generates the RTCK signal each time it receives the TCK signal from the JTAG interface module 404. The JTAG interface module 404 does not send another TCK signal until it has received the RTCK signal from a previous TCK. This functionality may be used to stop the TCK signal from the JTAG interface module 404 as described later herein. The signal generator module 552 provides the TDI and TMS signals to the low speed serializer 430.

Figure 10A:
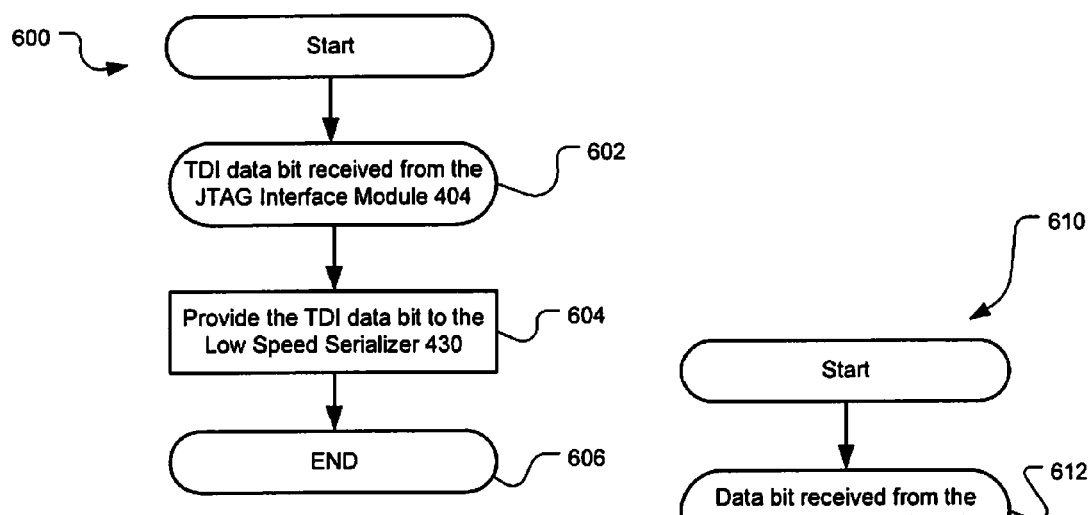
FIGS. 10A-10C are flowcharts showing methods of operating the module of FIG. 9.
Figure 10B:
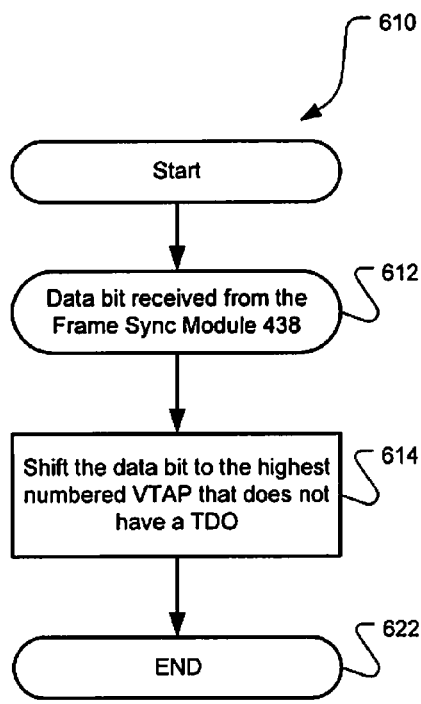
Figure 10C:
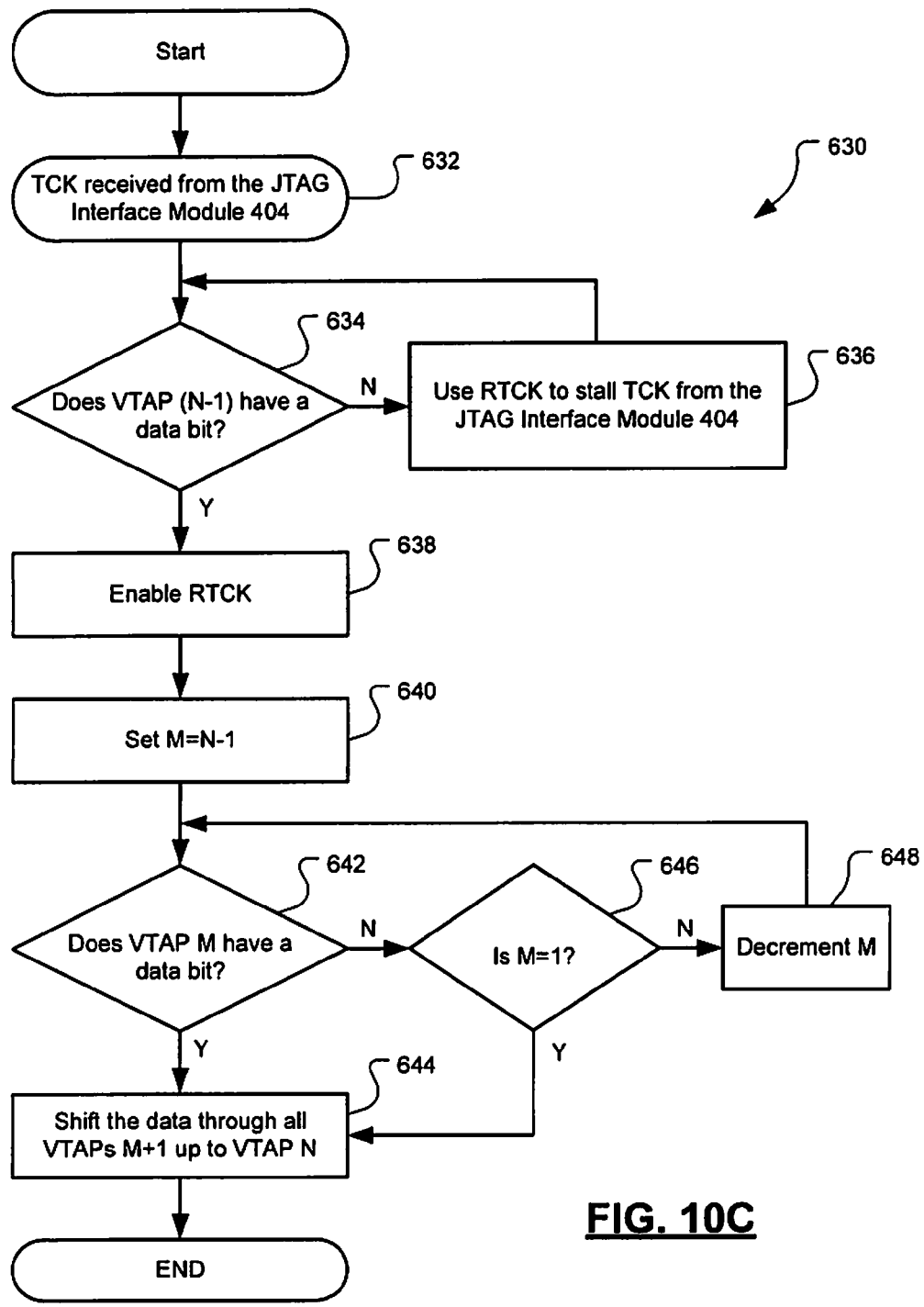

Referring now to FIGS. 10A-10C, operation of the module 427 will be described. A first method 600 may be executed by the signal generator module 552 each time a data bit is received from TDI of the JTAG interface module 404. Upon receiving the data bit in block 602, the method proceeds to block 604. In block 604, the method 600 provides the data bit to the low speed serializer 430. The method 600 then proceeds to block 606 and terminates.

A second method 610 may be executed by the JTAG signal generator module 552 each time a data bit is received from the frame sync module 438. Upon receiving the data bit in block 612, the method 610 proceeds to block 614. In block 614, the method 610 shifts the data bit from the first VTAP 550-1 to the highest numbered VTAP 550 that does not yet have a TDO data bit (i.e., in FIG. 7 the data bit is shifted right from the first VTAP 550-1 through the VTAPs 550 until it reaches the last empty VTAP 550. Each of the VTAPs 550 holds one bit.) The method 610 then proceeds to decision block 616 and terminates.

The second method 610 effectively creates a FIFO buffer from the VTAPs 550. The VTAPs 550 shift the data bit at a speed faster than the TCK signal from the JTAG interface module 404. For example, the VTAPs 550 may shift the data bit at 200 MHz and the TCK signal from the JTAG interface module 404 may operate at 20 MHz. With these example speeds, an optimal benefit may be achieved by using 200/20=10 VTAPs 550.

A third method 630 may be may be executed by the signal generator module 552 each time a TCK signal, such as one of a rising and falling edge, is received from the JTAG interface module 404. Upon receiving the TCK signal, the method 630 proceeds from block 632 to decision block 634. In decision block 634, the method 630 determines whether VTAP (N−1) 550-(N−1) has a TDO data bit. If not, the method 630 proceeds to block 636 and uses RICK to stall TCK from the JTAG interface module 404. The method 630 then returns to decision block 634. When decision block 634 indicates that VTAP (N−1) 550-(N−1) has a TDO data bit, the method 630 proceeds to block 638 and enables RICK. The method 630 then proceeds to block 640 and sets M=N−1 before proceeding to decision block 642. In decision block 642, the method 630 determines whether VTAP M 550-M has a TDO data bit. If so, the method 630 proceeds to block 644 and shifts the TDO data bits to the right through all of the VTAPs M+1 up to VTAP N 550-N. The method 630 then terminates.

Returning to decision block 642, if the method 630 determines that VTAP M 550-M does not have a TDO data bit, then the method 630 proceeds to decision block 646. In decision block 646, the method 630 determines whether M is equal to 1. If not, then the method 630 proceeds to block 648 and decrements M before returning to decision block 642. Alternatively, if decision block 646 determines that M is equal to 1, then the method 630 proceeds to block 644 and shifts the TDO data bits to the right through all of the VTAPs M+1 up to VTAP N 550-N. The method 630 then terminates.

Continuous bandwidth is achieved by using the methods 600, 610, and 630 with the system 400', thereby hiding an initial latency of the system 400. For multiple processor applications, the serial implementations of the present invention provide additional advantages. The additional processor (s) may be traced and cross-triggered at the same time. With parallel implementations, either twice as many pins would be needed or only a single processor can be traced at a time.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A system for testing an integrated circuit, the system comprising:
   a deserializer external to the integrated circuit, the deserializer configured to 0 receive messages in a serial data format, wherein the messages include test results associated with the integrated circuit, and ii) deserialize the messages into data frames;
   a frame sync module configured to provide control code based on the data frames, wherein the control code includes, in a digital format, status information associated with the messages deserialized into the data frames; and a diagnostic module configured to generate, based on the status information included in the control code, diagnostic data associated with states of the integrated circuit.

2. The system of claim 1, wherein:
the integrated circuit is located in a system on a chip; and
the deserializer, the frame sync module, and/or the diagnostic module are external to the system on a chip.

3. The system of claim 1, further comprising a logic analyzer configured to i) receive the control code from the diagnostic module.

4. The system of claim 1, wherein the diagnostic module is configured to convert the control code from the digital format to an analog format.

5. The system of claim 1, wherein the status information includes error messages corresponding to the test results associated with the integrated circuit.

6. The system of claim 1, wherein the messages in the serial format include the control code.

7. The system of claim 6, further comprising a diagnostic control module configured to generate the control code to be included in the messages in the serial format.

8. The system of claim 7, wherein the diagnostic control module is located in a system on a chip with the integrated circuit.

9. The system of claim 7, wherein the diagnostic control module is configured to selectively adjust a number of data words to be included in the control code.

10. A method of testing an integrated circuit, the method comprising:
receiving messages in a serial data format, wherein the messages include test results associated with the integrated circuit;
deserializing the messages into data frames;
providing control code based on the data frames, wherein the control code includes, in a digital format, status information associated with the messages deserialized into the data frames; and
generating, based on the status information included in the control code, diagnostic data associated with states of the integrated circuit.

11. The method of claim 10, wherein
the integrated circuit is located in a system on a chip, and
each of i) the receiving the messages in the serial format, ii) the deserializing the messages into the data frames, iii) the providing the control code based on the data frames, and iv) the generating the diagnostic data associated with the states of the integrated is performed external to the system on a chip.

12. The method of claim 10, further comprising receiving the control code at a logic analyzer.

13. The method of claim 10, further comprising converting the control code from the digital format to an analog format.

14. The method of claim 10, wherein the status information includes error messages corresponding to the test results associated with the integrated circuit.

15. The method of claim 10, wherein the messages in the serial format include the control code.

16. The method of claim 15, further comprising generating, in a system on a chip that includes the integrated circuit, the control code to be included in the messages in the serial format.

17. The method of claim 16, further comprising selectively adjusting a number of data words to be included in the control code.

* * * * *